US008289792B2

(12) United States Patent  (10) Patent No.: US 8,289,792 B2
Kudou  (45) Date of Patent: Oct. 16, 2012

(54) MEMORY TEST CIRCUIT, SEMICONDUCTOR INTEGRATED CIRCUIT AND MEMORY TEST METHOD

(75) Inventor: Kazuya Kudou, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 268 days.

(21) Appl. No.: 12/840,544

(22) Filed: Jul. 21, 2010

(65) Prior Publication Data

US 2011/0026340 A1   Feb. 3, 2011

(30) Foreign Application Priority Data

Aug. 3, 2009  (JP) ................... 2009-180868

(51) Int. Cl.
 *G11C 29/12*   (2006.01)
(52) U.S. Cl. ...................... 365/201; 365/200
(58) Field of Classification Search .................. None
See application file for complete search history.

(56) References Cited

U.S. PATENT DOCUMENTS

2007/0291560 A1* 12/2007 Hsieh et al. ............. 365/200
2008/0037340 A1*  2/2008 Ouellette et al. ........ 365/200

FOREIGN PATENT DOCUMENTS

JP     2003-36694 A    2/2003

* cited by examiner

*Primary Examiner* — Hoai V Ho
*Assistant Examiner* — James G Norman
(74) *Attorney, Agent, or Firm* — Foley & Lardner LLP

(57) ABSTRACT

A memory test circuit tests a memory including an actual array portion and a redundancy portion. The memory test circuit includes: an input data selector outputting first test data excluding data for the redundancy portion in test data representing data for the actual array portion and the redundancy portion as input selecting data in a redundancy BIST mode (RBM); an input data switching circuit outputting the test data as output test data to the memory in a direct BIST mode (DBM), and outputting data obtained by adding redundancy bits to the input selecting data as the output test data to the memory based on the input selecting data and output redundancy codes representing redundancy codes in the RBM; an output data switching circuit outputting data obtained by removing the redundancy bits from read data as output selecting data based on the read data from the memory and the output redundancy codes in the RBM; and a memory BIST comparator checking a value of the read data with a checking expectation value to output a checking result as a test result in the DBM, and checking a value of the output selecting data with an expectation value for the actual array portion in the checking expectation value to output a checking result as the test result in the RBM.

14 Claims, 8 Drawing Sheets

MEMORY TEST CIRCUIT, SEMICONDUCTOR INTEGRATED CIRCUIT AND MEMORY TEST METHOD

INCORPORATION BY REFERENCE

This application is based upon and claims the benefit of priority from Japanese patent application No. 2009-180868 filed on Aug. 3, 2009, the disclosure of which is incorporated herein in its entirety by reference.

BACKGROUND OF THE INVENTION

1. Field of the Invention

The present invention relates to a memory test circuit, a semiconductor integrated circuit and a memory test method, and particularly to a memory test circuit, a semiconductor integrated circuit and a memory test method that perform a test for a memory.

2. Description of Related Art

In recent years, among components mounted in a semiconductor integrated circuit, the number of memories that store data therein has been increased. For this reason, most of an area of the semiconductor integrated circuit is occupied by the memories. With such an increase in the number of memories, there is an increasing demand of improvement of a test quality and improvement of yields against manufacturing failures of the memories due to microfabrication processes.

As a method of improving the test quality, a memory test by using BIST (Built In Self Test) (hereinafter referred to as memory BIST) is widely known. By applying an arbitrary and complicated test algorism to the memory BIST, failures of various memories can be detected.

As a method of improving yields, a structure in which a redundant storage area is previously reserved in a part of data storage areas of a memory and a storage area where a failure exists is replaced with the redundant storage area (hereinafter referred to a redundancy structure) is generally adopted. In a test for the memory having the redundancy structure, the memory BIST is generally applied to all storage areas including the redundant storage area as test targets.

In such circumstances, in the memory BIST, it is required to extend a test range such that apart of a circuit (user circuit) that performs writing/reading data between a system logic and the memory is also tested at the actual speed by making use of a feature of enabling writing/reading of data to/from a memory to be tested at an actual speed.

FIG. 1 is a block diagram showing a configuration of a relief analyzing circuit for a semiconductor device as described in Japanese Patent Publication No. JP2003-36694A as a related art memory test circuit.

A related art memory test circuit includes a relief analyzing circuit 4 and an ALPG (Algorithmic Pattern Generator, test signal generating circuit) 5. The relief analyzing circuit 4 and the ALPG 5 are memory test circuits mounted to the memory BIST and are connected to a memory array 1. The memory array 1 includes an actual array portion 2 and a redundant portion 3. The ALPG 5 generates test signals such as an address signal and an expectation value, for performing the test for the memory array 1.

The relief analyzing circuit 4 includes a comparing portion 6, an address processing portion 7, a failure storing portion 8 and a relief analyzing portion 9. The comparing portion 6 compares data read from the actual array portion 2 or the redundant portion 3 with the expectation value of the ALPG 5 and determines whether or not a failure exists in the actual array portion 2 or the redundant portion 3. The address processing portion 7 receives an address signal and a redundant portion test signal from the ALPG 5 and generates an internal address for the redundant portion 3. The failure storing portion 8 stores failure information of the memory array 1 therein according to the determination of the comparing portion 6. The failure storing portion 8 includes a failure address storing portion formed by extending an actual array size by 1 bit in both of row and column directions. Thus, even when a failure occurs in the redundant portion 3, the failure storing portion 8 can simultaneously store the failure in the redundant portion 3 together with a failure in the actual array portion 2. Accordingly, the failure storing portion 8 is configured to have a virtual memory writing area that is four times as large as the actual array portion 2. The relief analyzing portion 9 performs relief analysis based on the information stored in the failure storing portion 8.

Although a relief solution for relieving a failure circuit of the memory array 1 with a redundant circuit of the redundant portion 3 is held in the relief analyzing portion 9, in the case that the relief solution represents a failure redundant circuit of the redundant portion 3 in performing a read operation, the relief analyzing portion 9 outputs another relief solution.

Relief analyzing processing as an operations of the related art memory test circuit will be described. FIG. 2 is a schematic view showing failure portions of the memory array 1 in FIG. 1.

It is assumed that the ALPG 5 performs a memory test for the actual array portion 2 and a failure 10 occurs in a part of the actual array portion 2 as shown in FIG. 2. The failure 10 that has occurred at testing of an address (0, 0) is determined as a failure by the comparing portion 6. At this time, the ALPG 5 outputs the redundant portion test signal having its signal level (logical level) of "L (Low level)" and the address signal representing the address (0, 0) (row and column addresses are n and m bits, respectively) to the address processing portion 7. In response to the redundant portion test signal of "L", the address processing portion 7 outputs an address (0, 0) obtained by adding 1 bit of 0 (zero) as the most significant bit of the address (0, 0) represented by the address signal (row and column addresses are n+1 and m+1 bits, respectively) to the failure storing portion 8. Failure address information representing the address (0, 0) (row and column addresses are n+1 and m+1 bits, respectively) is stored in the failure storing portion 8.

It is assumed that the ALPG 5 performs a memory test for the redundant portion 3 and a failure 11 occurs at a redundant ROW0 of the redundant portion 3 as shown in FIG. 2. At this time, the ALPG 5 outputs the redundant portion test signal having its signal level of "H (High level)" to the address processing portion 7. In response to the redundant portion test signal of "H", the address processing portion 7 outputs address (1000 ..., 0) obtained by adding 1 (one) as the most significant bit of the address (0, 0) represented by the address signal (row and column addresses are n+1 and m+1 bits, respectively) to the failure storing portion 8. Failure address information representing the address (1000 ..., 0) (row and column addresses are n+1 and m+1 bits, respectively) is stored in the failure storing portion 8.

As described above, although the relief solution for relieving the failure 10 with the redundant ROW0 and the failure 11 with a redundant ROW1 is held in the relief analyzing portion 9 by the relief analyzing processing. Since the failure exists at the redundant ROW0, an optimum solution for relieving the failure 10 with the redundant ROW1 is outputted.

I have now discovered the following facts.

In the related art memory test circuit, due to the configuration, an address representing only an actual array portion of a memory array to be tested is used as an interface. Accordingly, it is impossible to test the actual array portion and a redundant portion separately. For this reason, a test quality is disadvantageously lowered.

SUMMARY

The present invention seeks to solve one or more of the above problems, or to improve upon those problems at least in part.

In one embodiment, a memory test circuit which tests a test target memory including an actual array portion and a redundancy portion, includes: an input data selector configured to output first test data excluding data for the redundancy portion in test data representing data for the actual array portion and the redundancy portion as input selecting data in a redundancy memory BIST (Built In Self Test) mode; an input data switching circuit configured to output the test data as output test data to the test target memory in a direct memory BIST mode, and output data obtained by adding redundancy bits to the input selecting data as the output test data to the test target memory based on the input selecting data and output redundancy codes representing redundancy codes in the redundancy memory BIST mode; an output data switching circuit configured to output data obtained by removing the redundancy bits from read data as output selecting data based on the read data from the test target memory and the output redundancy codes in the redundancy memory BIST mode; and a memory BIST comparator configured to check a value of the read data with a checking expectation value to output a result of the checking as a test result in the direct memory BIST mode, and check a value of the output selecting data with an expectation value for the actual array portion in the checking expectation value to output a result of the checking as the test result in the redundancy memory BIST mode.

In another embodiment, a semiconductor integrated circuit includes: a test target memory configured to include an actual array portion and a redundancy portion; and a memory test circuit configured to test the test target memory, wherein the memory test circuit includes: an input data selector configured to output first test data excluding data for the redundancy portion in test data representing data for the actual array portion and the redundancy portion as input selecting data in a redundancy memory BIST (Built In Self Test) mode; an input data switching circuit configured to output the test data as output test data to the test target memory in a direct memory BIST mode, and output data obtained by adding redundancy bits to the input selecting data as the output test data to the test target memory based on the input selecting data and output redundancy codes representing redundancy codes in the redundancy memory BIST mode; an output data switching circuit configured to output data obtained by removing the redundancy bits from read data as output selecting data based on the read data from the test target memory and the output redundancy codes in the redundancy memory BIST mode; and a memory BIST comparator configured to check a value of the read data with a checking expectation value to output a result of the checking as a test result in the direct memory BIST mode, and check a value of the output selecting data with an expectation value for the actual array portion in the checking expectation value to output a result of the checking as the test result in the redundancy memory BIST mode.

In another embodiment, a memory test method of testing a test target memory including an actual array portion, and a redundancy portion, includes: outputting test data representing data for the actual array portion and the redundancy portion as output test data to the test target memory in a direct memory BIST (Built In Self Test) mode; checking a value of read data from the test target memory with a checking expectation value to output a result of the checking as a test result in the direct memory BIST mode; outputting first test data excluding data for the redundancy portion in the test data as input selecting data in a redundancy memory BIST mode; outputting data obtained by adding redundancy bits to the input selecting data as the output test data to the test target memory based on the input selecting data and output redundancy codes representing redundancy codes in the redundancy memory BIST mode; outputting data obtained by removing the redundancy bits from read data as output selecting data based on the read data from the test target memory and the output redundancy codes in the redundancy memory BIST mode; and checking a value of the output selecting data with an expectation value for the actual array portion in the checking expectation value to output a result of the checking as said test result in said redundancy memory BIST mode.

As described above, in the memory test circuit according to the present invention, in order to extend a test range, two test paths of a direct memory BIST mode and a redundancy memory BIST mode are realized. Thus, the memory test circuit according to an embodiment of the present invention can perform memory BIST that covers all of the bits for an actual array portion and a redundant portion of a memory to be tested (MEMR) in the direct memory BIST mode, and memory BIST that covers only bits for the actual array portion of the memory to be tested (MEMR) in the redundancy memory BIST mode. As described above, the memory test circuit of the present invention can test the actual array portion and the redundant portion separately. Therefore, a test quality is not lowered than the related art.

BRIEF DESCRIPTION OF DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENT

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A memory test circuit according to an embodiment of the present invention will be described in detail below referring to accompanying drawings.

[Configuration]

Figure 1:
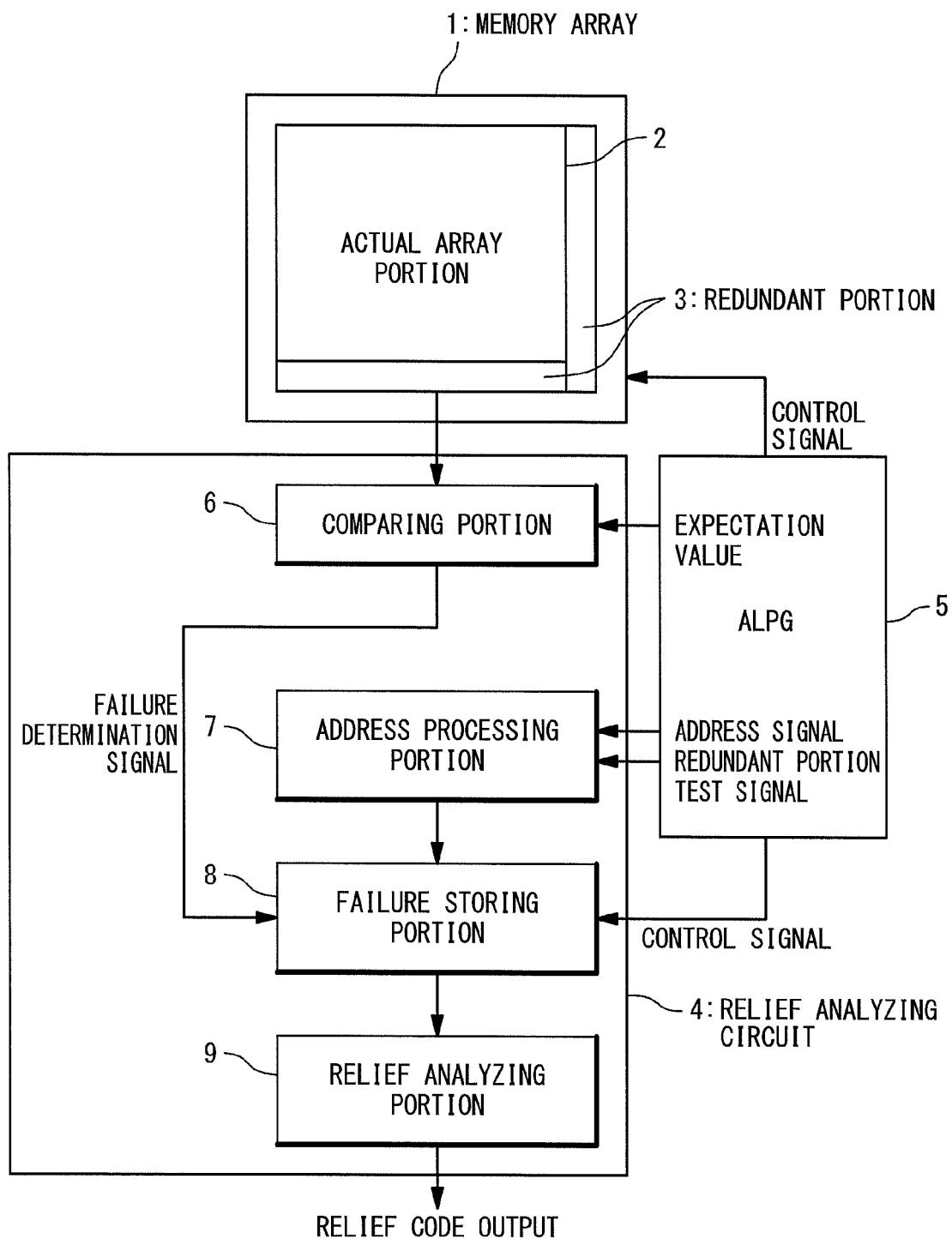
FIG. 1 is a block diagram showing a configuration of a relief analyzing circuit of a semiconductor device as described in JP2003-36694A as a related art test circuit for a semiconductor integrated circuit.
Figure 2:
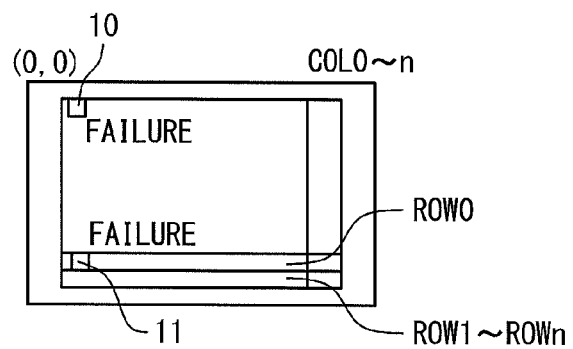
FIG. 2 is a schematic view showing failure portions of a memory array 1 in FIG. 1.
Figure 3:
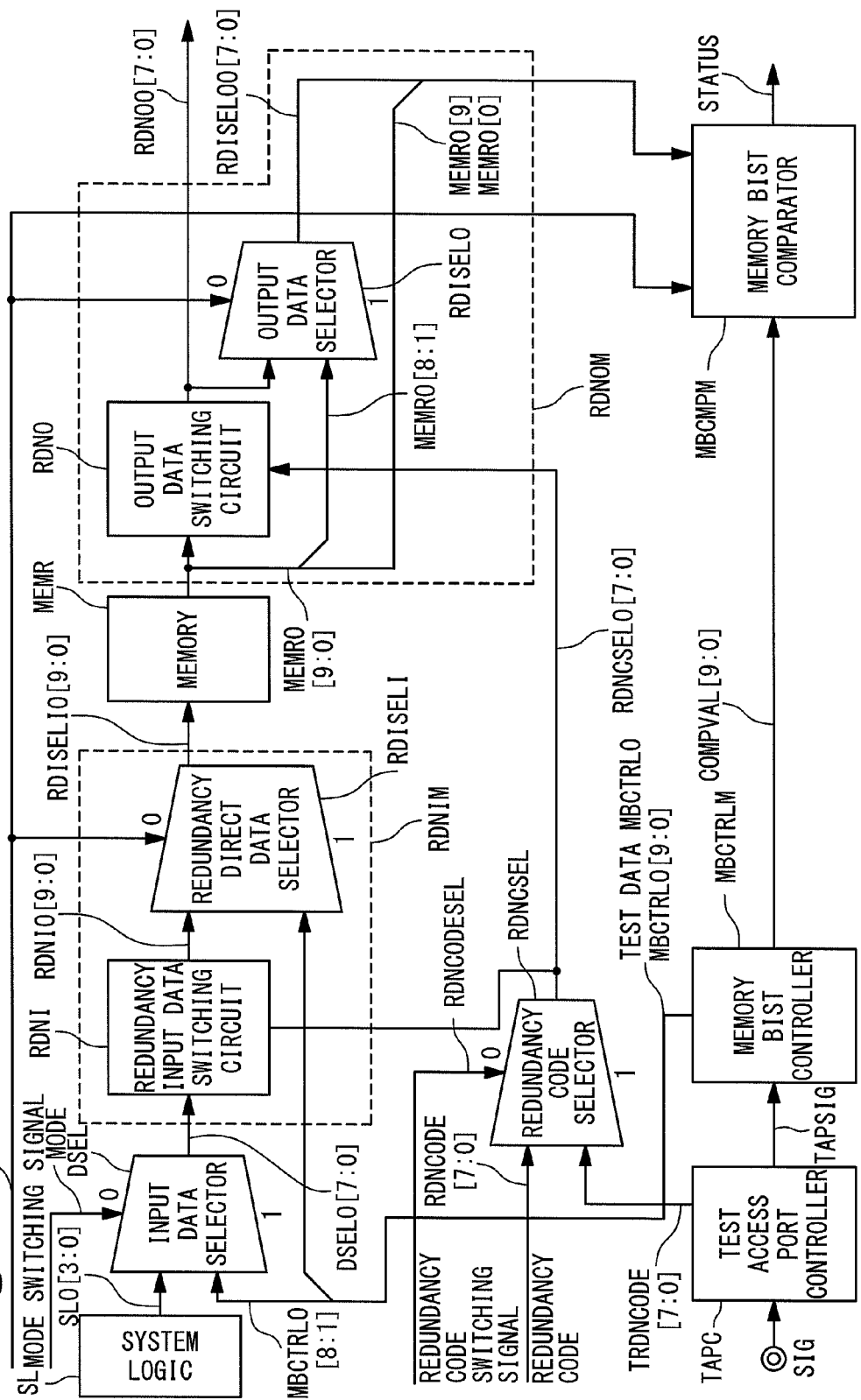
FIG. 3 is a block diagram showing a memory test circuit according to an embodiment of the present invention.

FIG. 3 is a block diagram showing the memory test circuit according to the embodiment of the present invention.

The memory test circuit according to the embodiment of the present invention is connected to a memory MEMR to be tested. The memory test circuit and the memory MEMR to be tested constitute a semiconductor integrated circuit.

The memory test circuit according to the embodiment of the present invention includes a system logic SL, a test access port controller TAPC, a memory BIST controller MBCTRLM, an input data selector DSEL, a redundancy code selector RDNCSEL, an input data switching circuit RDNIM, an output data switching circuit RDNOM and a memory BIST comparator MBCMPM.

The input data switching circuit RDNIM includes a redundancy input data switching circuit RDNI and a redundancy direct data selector RDISELI. The output data switching circuit RDNOM includes a redundancy output data switching circuit RDNO and an output data selector RDISELO.

The system logic SL outputs data for an actual array portion as data SLO [7:0].

The memory test circuit according to the embodiment of the present invention performs a direct memory BIST mode and a redundancy memory BIST mode. For this reason, a test mode signal SIG is supplied to the test access port controller TAPC. For example, when a signal level of the test mode signal SIG is a low level (LOW level), the redundancy memory BIST mode is performed. When the signal level of the test mode signal SIG is a high level (HIGH level), the direct memory BIST mode is performed.

In the direct memory BIST mode, a redundancy direct switching signal RDNDISEL, a redundancy code switching signal RDNCODESEL and a mode switching signal MODE are set to be in an active state, an active state and an inactive state, respectively. That is, their signal levels are set to a HIGH level, a HIGH level and a LOW level, respectively.

In the redundancy memory BIST mode, the redundancy direct switching signal RDNDISEL, the redundancy code switching signal RDNCODESEL, the mode switching signal MODE are set to be in the inactive state, the active state and the active state, respectively. That is, their signal levels are set to a LOW level, a HIGH level and a HIGH level, respectively.

In the direct memory BIST mode, the test access port controller TAPC outputs a control signal TAPSIG to the memory BIST controller MBCTRLM.

In the redundancy memory BIST mode, the test access port controller TAPC outputs the control signal TAPSIG to the memory BIST controller MBCTRLM, and outputs test redundancy codes TRDNCODE [7:0] representing redundancy codes obtained from a memory BIST test result STATUS in the case where the direct memory BIST mode is performed to the redundancy code selector RDNCSEL.

In response to the control signal TAPSIG from the test access port controller TAPC, the memory BIST controller MBCTRLM outputs test data MBCTRLO [9:0] representing data for the actual array portion and the redundant portion to the input data selector DSEL and the redundancy direct data selector RDISELI, and outputs checking expectation values COMPVAL [9:0] corresponding to the test data MBCTRLO [9:0] to the memory BIST comparator MBCMPM.

When a signal level of the mode switching signal MODE is a LOW level, the input data selector DSEL selects the data SLO [7:0] from the system logic SL and outputs the selected data as input selecting data DSELO [7:0] to the redundancy input data switching circuit RDNI. When the signal level of the mode switching signal MODE is a HIGH level, the input data selector DSEL selects test data MBCTRLO [8:1] obtained by removing data (redundant bits) for the redundant portion among the test data MBCTRLO [9:0] from the memory BIST controller MBCTRLM and outputs the selected data as the input selecting data DSELO [7:0] to the redundancy input data switching circuit RDNI.

When a signal level of the redundancy code switching signal RDNCODESEL is a LOW level, the redundancy code selector RDNCSEL selects redundancy codes RDNCODE [7:0] and outputs the selected codes as output redundancy codes RDNCSELO [7:0] to the redundancy input data switching circuit RDNI and the redundancy output data switching circuit RDNO. When the signal level of the redundancy code switching signal RDNCODESEL is a HIGH level, the redundancy code selector RDNCSEL selects the test redundancy codes TRDNCODE [7:0] from the test access port controller TAPC and outputs the selected code as the output redundancy codes RDNCSELO [7:0] to the redundancy input data switching circuit RDNI and the redundancy output data switching circuit RDNO.

Based on the input selecting data DSELO [7:0] from the input data selector DSEL and the output redundancy codes RDNCSELO [7:0] from the redundancy code selector RDNCSEL, the redundancy input data switching circuit RDNI outputs redundancy input data RDNIO [9:0] obtained by adding the redundant bits to the input selecting data DSELO [7:0] to the redundancy direct data selector RDISELI.

When a signal level of the redundancy direct switching signal RDNDISEL is a LOW level, the redundancy direct data selector RDISELI selects the redundancy input data RDNIO [9:0] from the redundancy input data switching circuit RDNI and outputs the selected data as output test data RDISELIO [9:0] to the memory MEMR to be tested. When the signal level of the redundancy direct switching signal RDNDISEL is a HIGH level, the redundancy direct data selector RDISELI selects the test data MBCTRLO [9:0] from the memory BIST controller MBCTRLM and outputs the selected data as the output test data RDISELIO [9:0] to the memory MEMR to be tested. Based on the output test data RDISELIO [9:0], read data MEMRO [9:0] is read from the memory MEMR to be tested.

Based on the read data MEMRO [9:0] from the memory MEMR to be tested and the output redundancy codes RDNCSELO [7:0] from the redundancy code selector RDNCSEL, the redundancy output data switching circuit RDNO outputs redundancy output data RDNOO [7:0] obtained by removing redundant bits from the read data MEMRO [9:0] to the output data selector RDISELO.

When the signal level of the redundancy direct switching signal RDNDISEL is a LOW level, the output data selector RDISELO selects the redundancy output data RDNOO [7:0] from the redundancy output data switching circuit RDNO and outputs the selected data as the output selecting data RDISELOO [7:0] to the memory BIST comparator MBCMPM.

When the signal level of the redundancy direct switching signal RDNDISEL is a HIGH level, the output data selector RDISELO selects read data MEMRO [8:1] obtained by removing read data MEMRO [9], [0] (redundant bits) for the redundant portion among the read data MEMRO [9:0] from the memory MEMR to be tested and outputs the data MEMRO [8:1] as the output selecting data RDISELOO [7:0] to the memory BIST comparator MBCMPM.

When the signal level of the redundancy direct switching signal RDNDISEL is a LOW level, the memory BIST comparator MBCMPM creates mode expectation values [9], [0] according to the redundancy memory BIST mode with respect to the read data MEMRO [9], [0] for the redundant portion among the read data MEMRO [9:0] from the memory MEMR to be tested. Specifically, the memory BIST comparator MBCMPM carries out logical ANDs between values represented by the read data MEMRO [9], [0] for the redundant portion among the read data MEMRO [9:0] from the memory MEMR to be tested and a value "0" represented by the signal level (LOW level) of the redundancy direct switching signal RDNDISEL to create the mode expectation values [9], [0] for redundant portion. The memory BIST comparator MBCMPM checks the mode expectation values [9], [0] with expectation values for the redundant portion among the checking expectation values COMPVAL [9:0] from the memory BIST controller MBCTRLM and masks them. The memory BIST comparator MBCMPM checks values represented by the output selecting data RDISELOO [7:0] from the output data selector RDISELO with expectation values for the actual array portion among the checking expectation values COMPVAL [9:0] from the memory BIST controller MBCTRLM and outputs the checking result as the memory BIST test result STATUS.

That is, when the signal level of the redundancy direct switching signal RDNDISEL is a LOW level, using only 8 bits of the output selecting data RDISELOO [7:0] as targets, the memory BIST comparator MBCMPM checks the values represented by the output selecting data RDISELOO [7:0] with the expectation values for the actual array portion among the checking expectation values COMPVAL [9:0] and outputs the checking result as the memory BIST test result STATUS.

When the signal level of the redundancy direct switching signal RDNDISEL is a HIGH level, the memory BIST comparator MBCMPM creates the mode expectation values [9], [0] according to the direct memory BIST mode with respect to values represented by the read data MEMRO [9], [0] for the redundant portion among the read data MEMRO [9:0] from the memory MEMR to be tested. More specifically, the memory BIST comparator MBCMPM carries out logical ANDs between values represented by the read data MEMRO [9], [0] for the redundant portion among the read data MEMRO [9:0] from the memory MEMR to be tested and a value "1" represented by the signal level (HIGH level) of the redundancy direct switching signal RDNDISEL to create the mode expectation values [9], [0] for the redundant portion. The memory BIST comparator MBCMPM checks the mode expectation values [9], [0] with the expectation values for the redundant portion among the checking expectation values COMPVAL [9:0] from the memory BIST controller MBCTRLM and masks them. The memory BIST comparator MBCMPM checks the values represented by the output selecting data RDISELOO [7:0] from the output data selector RDISELO with the expectation values for the actual array portion among the checking expectation values COMPVAL [9:0] from the memory BIST controller MBCTRLM and outputs the checking result as the memory BIST test result STATUS.

In other words, when the signal level of the redundancy direct switching signal RDNDISEL is a HIGH level, using all of 10 bits of the read data MEMRO [9], [0] for the redundant portion and the output selecting data RDISELOO [7:0] as a target, the memory BIST comparator MBCMPM checks values represented by the read data MEMRO [9], [0] for the redundant portion and the output selecting data RDISELOO [7:0] with the checking expectation values COMPVAL [9:0] and outputs the checking result as the memory BIST test result STATUS.

Figure 4:
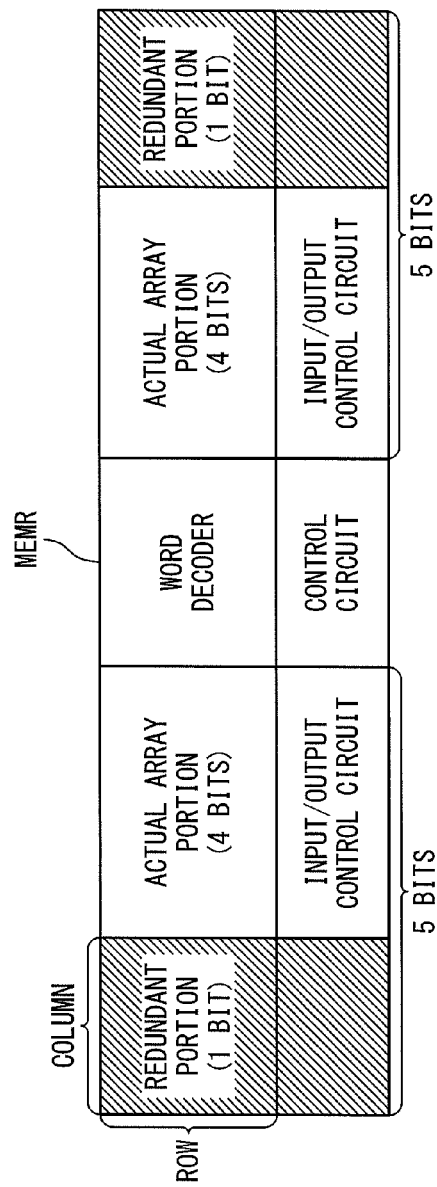
FIG. 4 is a block diagram showing a configuration of a memory MEMR to be tested connected to the memory test circuit according to the embodiment of the present invention.

FIG. 4 is a block diagram showing a configuration of the memory MEMR to be tested.

The memory MEMR to be tested includes the actual array portion necessary for an access from the system logic SL and the redundant portion for improving yields when a failure occurs. It is assumed that data bits of the actual array portion are 8 bits and data bits (redundant bits) of the redundant portion are 2 bits. The actual array portion (8 bits) includes a first actual array portion (4 bits) and a second actual array portion (4 bits). The redundant portion (2 bits) includes a first redundant portion (1 bit) corresponding to the first actual array portion (4 bits) and a second redundant portion (1 bit) corresponding to the second actual array portion (4 bits). A word decoder is adjacently provided between two actual array portions. Two input/output control circuits are provided adjacent to two actual array portions, respectively. The control circuit controls the word decoder and the input/output control circuits.

Figure 5:
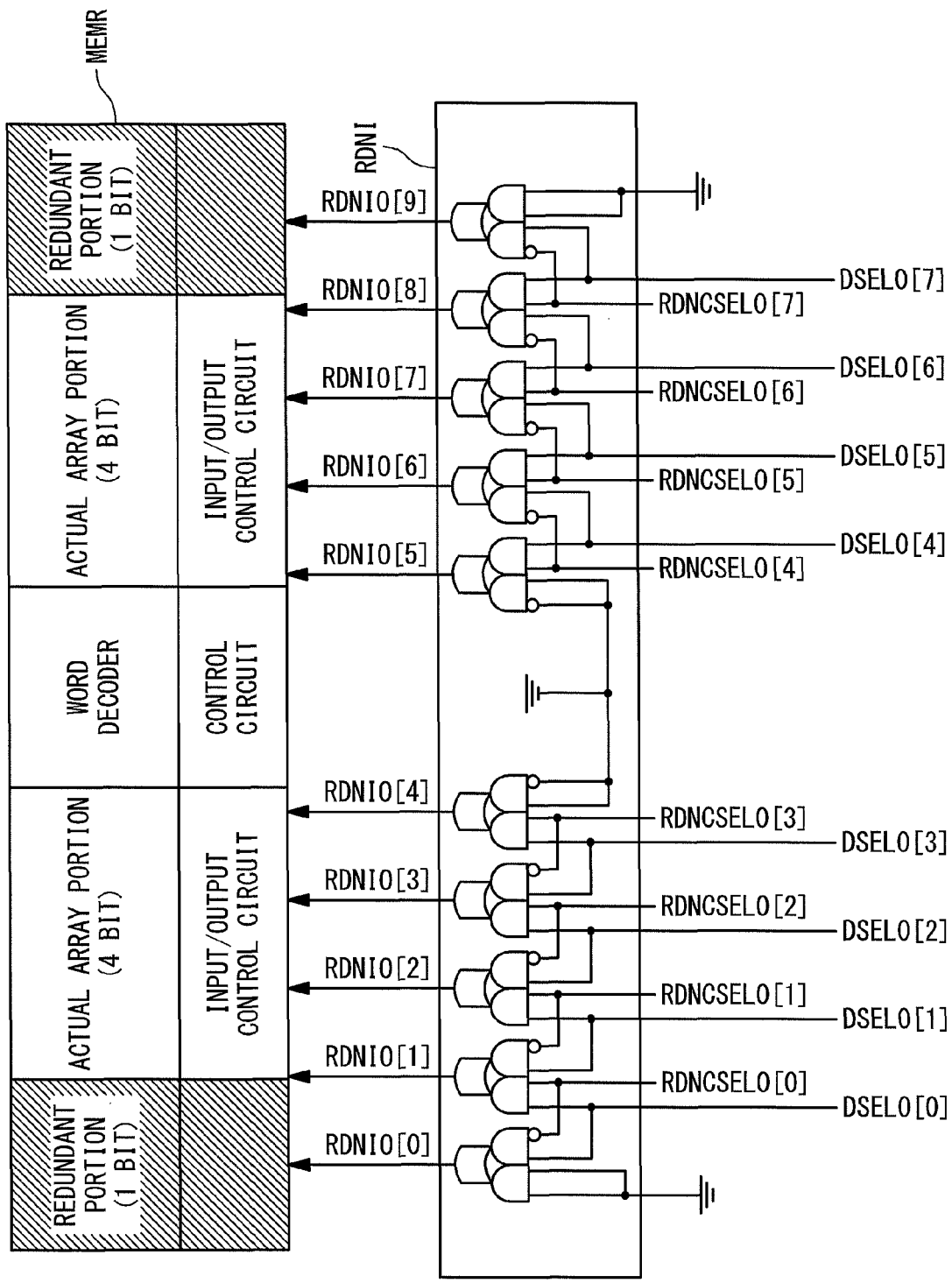
FIG. 5 is a view showing an example of connection relationship between a configuration of a redundancy input data switching circuit RDNI in the memory test circuit in FIG. 3 and the memory MEMR to be tested in FIG. 4.

FIG. 5 is a view showing an example of a configuration of the redundancy input data switching circuit RDNI and connection relationship between the configuration of the redundancy input data switching circuit RDNI and the memory MEMR to be tested.

The redundancy input data switching circuit RDNI includes first to twentieth AND circuits and first to tenth OR circuits. The first to twentieth AND circuits each have first and second input terminals and an output terminal. The second input terminals of the second, fourth, sixth, eighth, tenth, eleventh, thirteenth, fifteenth, seventeenth and nineteenth AND circuits among the first to twentieth AND circuits are inverting input terminals. The first to tenth OR circuits each have first and second input terminals and an output terminal.

A signal of a LOW level, the input selecting data DSELO [0], DSELO [1], DSELO [2], DSELO [3], DSELO [4], DSELO [5], DSELO [6], DSELO [7] of the input selecting data DSELO [7:0] and a signal of a LOW level are supplied to the first input terminals of the first, third, fifth, seventh, ninth, twelfth, fourteenth, sixteenth, eighteenth and twentieth AND circuits, respectively. A signal of a LOW level, the output redundancy codes RDNCSELO [0], RDNCSELO [1], RDNCSELO [2], RDNCSELO [3], RDNCSELO [4], RDNCSELO [5], RDNCSELO [6], RDNCSELO [7] of the output redundancy codes RDNCSELO [7:0] and a signal of a LOW level are supplied to the second input terminals of the first, third, fifth, seventh, ninth, twelfth, fourteenth, sixteenth, eighteenth and twentieth AND circuits, respectively. The input selecting data DSELO [0], DSELO [1], DSELO [2], DSELO [3] of the input selecting data DSELO [7:0], a signal of a HIGH level, a signal of a HIGH level, the input selecting data DSELO [4], DSELO [5], DSELO [6], and DSELO [7] of the input selecting data DSELO [7:0] are supplied to the first input terminals of the second, fourth, sixth, eighth, tenth, eleventh, thirteenth, fifteenth, seventeenth and nineteenth AND circuits, respectively. The output redundancy codes RDNCSELO [0], RDNCSELO [1], RDNCSELO [2], RDNCSELO [3] of the output redundancy codes RDNCSELO [7:0], a signal of a HIGH level, a signal of a HIGH level, the output redundancy code RDNCSELO [4], RDNCSELO [5], RDNCSELO [6], RDNCSELO [7] of the output redundancy codes RDNCSELO [7:0] are supplied to the second input terminals of the second, fourth, sixth, eighth, tenth, eleventh, thirteenth, fifteenth, seventeenth and nineteenth AND circuits, respectively. The output terminals of the first, third, fifth, seventh, ninth, twelfth, fourteenth, sixteenth, eighteenth and twentieth AND circuits are connected to the first input terminals of the first to tenth OR circuits, respectively. The output terminals of the second, fourth, sixth, eighth, tenth, eleventh, thirteenth, fifteenth, seventeenth and nineteenth AND circuits are connected to the second input terminals of the first to tenth OR circuits, respectively. The redundancy input data RDNIO [0] to [9] of the redundancy input data RDNIO [9:0] are outputted from the output terminals to the first redundant portion (1 bit), the first actual array portion (4 bits), the second actual array portion (4 bits) and the second redundant portion (1 bit).

Figure 6:
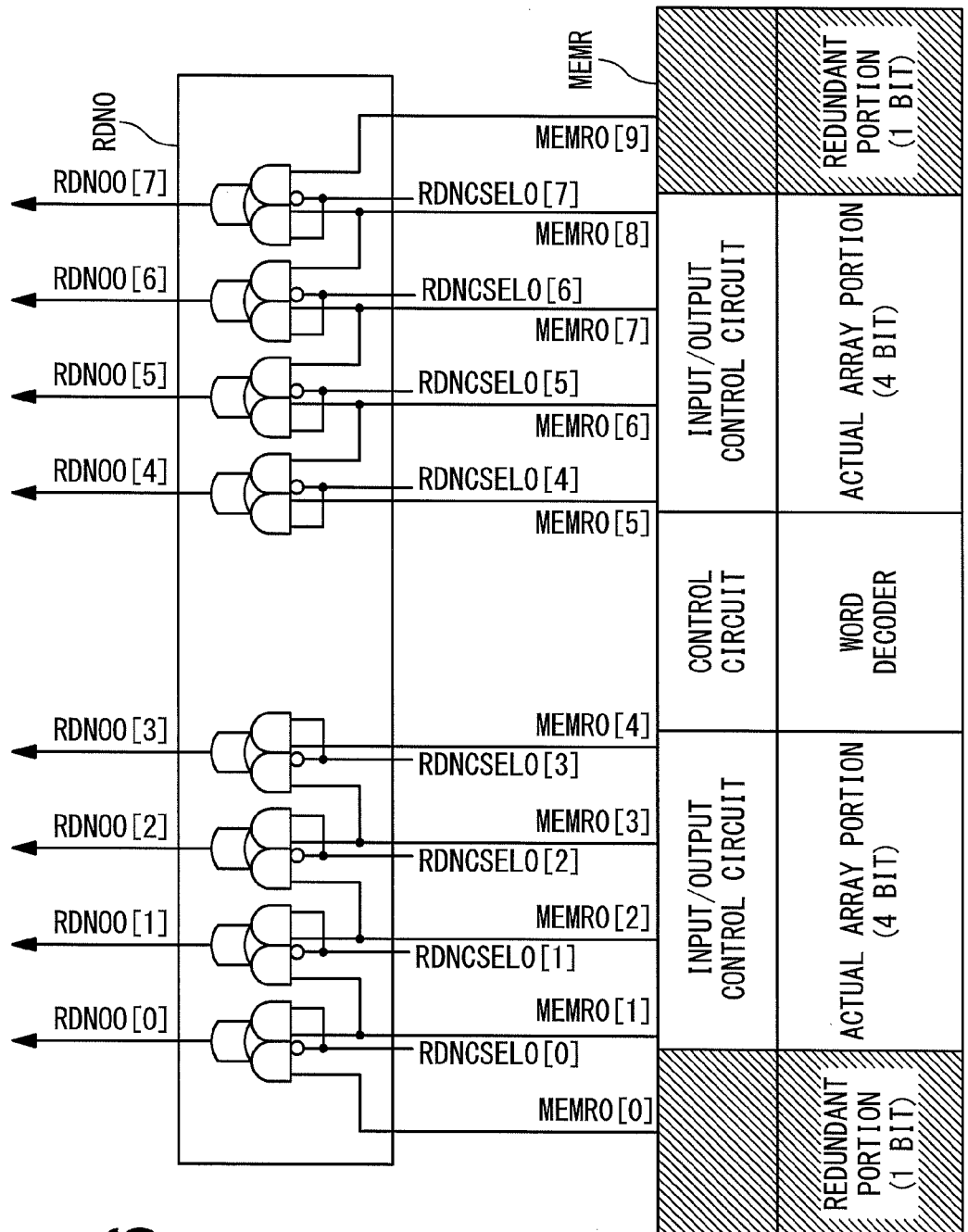
FIG. 6 is a view showing an example of connection relationship between a configuration of a redundancy output data switching circuit RDNO in the memory test circuit in FIG. 3 and the memory MEMR to be tested in FIG. 4.

FIG. 6 is a view showing an example of a configuration of the redundancy output data switching circuit RDNO and connection relationship between the configuration of the redundancy output data switching circuit RDNO and the memory MEMR to be tested.

The redundancy output data switching circuit RDNO includes first to sixteenth AND circuits and first to eighth OR circuits. The first to sixteenth AND circuits each have first and second input terminals and an output terminal. The second input terminals of the first, third, fifth, seventh, tenth, twelfth, fourteenth and sixteenth AND circuits of the first to sixteenth AND circuits are inverting input terminals. The first to eighth OR circuits each have first and second input terminals and an output terminal.

The read data MEMRO [0], [1], [1], [2], [2], [3], [3], [4], [5], [6], [6], [7], [7], [8], [8], [9] of the read data MEMRO [9:0] from the first redundant portion (1 bit), the first actual array portion (4 bits), the second actual array portion (4 bits) and the second redundant portion (1 bit) are supplied to the first input terminals of the first to sixteenth AND circuits, respectively. The output redundancy code RDNCSELO [0], [0], [1], [1], [2], [2], [3], [3], [4], [4], [5], [5], [6], [6], [7], [7] of the output redundancy codes RDNCSELO [7:0] are supplied to the second input terminals of the first to sixteenth AND circuits, respectively. The output terminals of the first, third, fifth, seventh, tenth, twelfth, fourteenth and sixteenth AND circuits are connected to the first input terminal of the first to eighth OR circuits, respectively. The output terminals of the second, fourth, sixth, eighth, ninth, eleventh, thirteenth and fifteenth AND circuits are connected to the second input terminal of the first to eighth OR circuits, respectively. The redundancy output data RDNOO [0] to RDNOO [7] of the redundancy output data RDNOO [7:0] are outputted from the output terminals of the first to eighth OR circuits, respectively.

Figure 7:
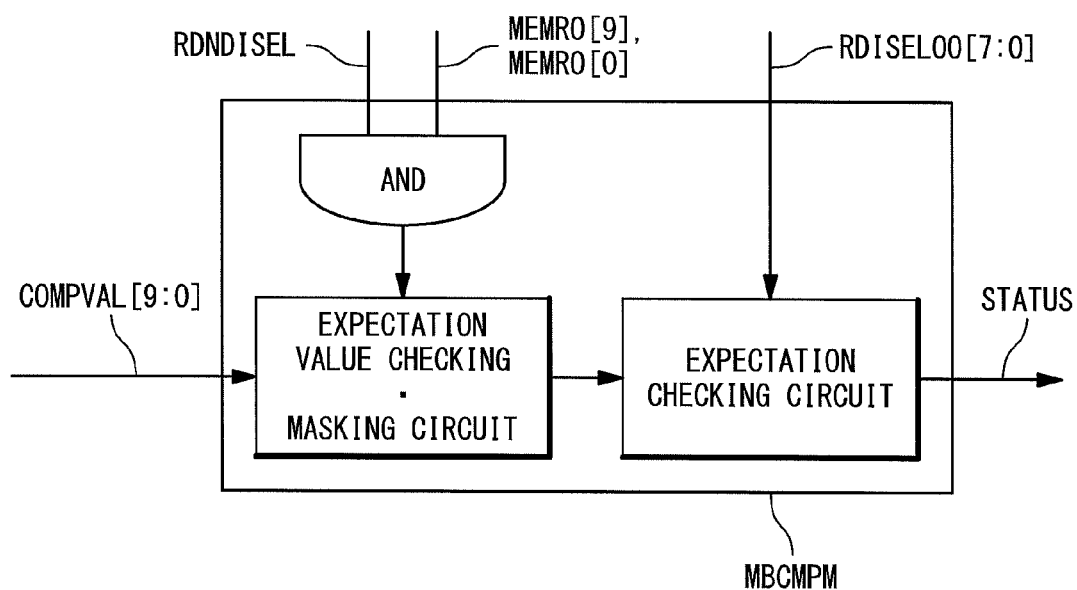
FIG. 7 is a view showing a configuration of a memory BIST comparator MBCMPM in the memory test circuit in FIG. 3.

FIG. 7 is a view showing a configuration of the memory BIST comparator MBCMPM.

The memory BIST comparator MBCMPM includes an AND circuit, an expectation value checking and masking circuit and an expectation value checking circuit. The AND circuit carries out logical ANDs of values represented by the read data MEMRO [9], [0] for the redundant portion among the read data MEMRO [9:0] from the memory MEMR to be tested and a value represented by the signal level of the redundancy direct switching signal RDNDISEL to create the mode expectation values [9], [0] for the redundant portion.

The expectation value checking and masking circuit checks the mode expectation values [9], [0] with expectation values for the redundant portion among the checking expectation values COMPVAL [9:0] from the memory BIST controller MBCTRLM and masks them. The expectation value checking circuit checks the values represented by the output selecting data RDISELOO [7:0] from the output data selector RDISELO with an expectation value for the actual array portion among the checking expectation values COMPVAL [9:0] from the memory BIST controller MBCTRLM and outputs the checking result as the memory BIST test result STATUS.

[Operations]

Figure 8:
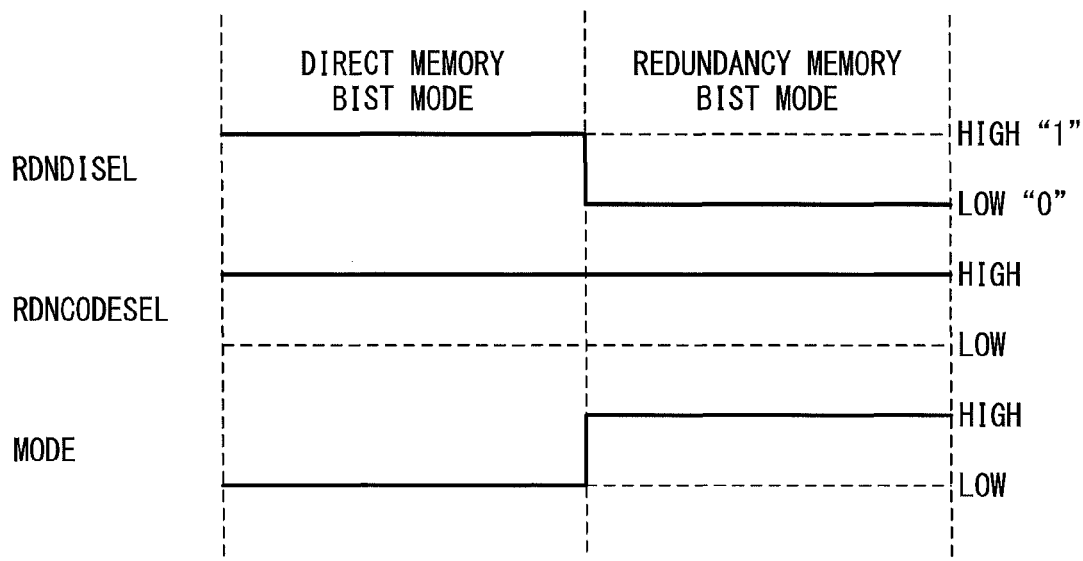
FIG. 8 is a timing chart showing operations of the memory test circuit according to the embodiment of the present invention.

FIG. 8 is a timing chart showing operations of the memory test circuit according to the embodiment of the present invention.

First, the direct memory BIST mode will be described.

The redundancy direct switching signal RNDDISEL, the redundancy code switching signal RDNCODESEL and the mode switching signal MODE are set to be in the active state, the active state and the inactive state, respectively. That is, their signal levels are set to a HIGH level, a HIGH level and a LOW level, respectively.

When the signal level of the test mode signal SIG is a HIGH level, the test access port controller TAPC outputs the control signal TAPSIG to the memory BIST controller MBCTRLM.

Based on the control signal TAPSIG from the test access port controller TAPC, the memory BIST controller MBCTRLM outputs the test data MBCTRLO [9:0] representing data for the actual array portion and the redundant portion to the input data selector DSEL and the redundancy direct data selector RDISELI, and outputs the checking expectation values COMPVAL [9:0] corresponding to the test data MBCTRLO [9:0] to the memory BIST comparator MBCMPM.

Since the signal level of the redundancy direct switching signal RDNDISEL is a HIGH level, the redundancy direct data selector RDISELI selects the test data MBCTRLO [9:0] from the memory BIST controller MBCTRLM and outputs the selected data as the output test data RDISELIO [9:0] to the memory MEMR to be tested. Based on the output test data RDISELIO [9:0], the read data MEMRO [9:0] is read from the memory MEMR to be tested.

Since the signal level of the redundancy direct switching signal RDNDISEL is a HIGH level, the output data selector RDISELO selects the read data MEMRO [8:1] obtained by removing the read data MEMRO [9], [0] (redundant bits) for the redundant portion among the read data MEMRO [9:0] from the memory MEMR to be tested and outputs the read data MEMRO [8:1] as the output selecting data RDISELOO [7:0] to the memory BIST comparator MBCMPM.

Since the signal level of the redundancy direct switching signal RDNDISEL is a HIGH level, the memory BIST comparator MBCMPM covers all of 10 bits of the read data MEMRO [9], [0] for the redundant portion among the read data MEMRO [9:0] from the memory MEMR to be tested and the output selecting data RDISELOO [7:0] from the output data selector RDISELO. In other words, all of 10 bits of the read data MEMRO [9:0] from the memory MEMR to be tested are covered. The memory BIST comparator MBCMPM checks values represented by the read data MEMRO [9], [0] for the redundant portion and the output selecting data RDISELOO [7:0] with the checking expectation values COMPVAL [9:0] and outputs the checking result as the memory BIST test result STATUS.

Next, the redundancy memory BIST mode will be described.

The redundancy direct switching signal RDNDISEL, the redundancy code switching signal RDNCODESEL and the mode switching signal MODE are set to be in the inactive state, the active state and the active state, respectively. That is, their signal levels are set to a LOW level, a HIGH level and a HIGH level, respectively.

When the signal level of the test mode signal SIG is a LOW level, the test access port controller TAPC outputs the control signal TAPSIG to the memory BIST controller MBCTRLM, and outputs the test redundancy codes TRDNCODE [7:0] representing redundancy codes obtained from the memory BIST test result STATUS when the direct memory BIST mode is performed to the redundancy code selector RDNCSEL.

Based on the control signal TAPSIG from the test access port controller TAPC, the memory BIST controller MBCTRLM outputs the test data MBCTRLO [9:0] representing data for the actual array portion and the redundant portion to the input data selector DSEL and the redundancy direct data selector RDISELI, and outputs the checking expectation values COMPVAL [9:0] corresponding to the test data MBCTRLO [9:0] to the memory BIST comparator MBCMPM.

Since the signal level of the mode switching signal MODE is a HIGH level, the input data selector DSEL selects the test data MBCTRLO [8:1] obtained by removing data (redundant bits) for the redundant portion among the test data MBCTRLO [9:0] from the memory BIST controller MBCTRLM and outputs the selected data as the input selecting data DSELO [7:0] to the redundancy input data switching circuit RDNI.

Since the signal level of the redundancy code switching signal RDNCODESEL is a HIGH level, the redundancy code selector RDNCSEL selects the test redundancy codes TRDNCODE [7:0] from the test access port controller TAPC and outputs the selected codes as the output redundancy codes RDNCSELO [7:0] to the redundancy input data switching circuit RDNI and the redundancy output data switching circuit RDNO.

Based on the input selecting data DSELO [7:0] from the input data selector DSEL and the output redundancy codes RDNCSELO [7:0] from the redundancy code selector RDNCSEL, the redundancy input data switching circuit RDNI outputs the redundancy input data RDNIO [9:0] obtained by adding data for the redundant bits to the input selecting data DSELO [7:0] to the redundancy direct data selector RDISELI.

Since the signal level of the redundancy direct switching signal RDNDISEL is a LOW level, the redundancy direct data selector RDISELI selects the redundancy input data RDNIO [9:0] from the redundancy input data switching circuit RDNI and outputs the selected data as the output test data RDISELIO [9:0] to the memory MEMR to be tested. Based on the output test data RDISELIO [9:0], the read data MEMRO [9:0] is read from the memory MEMR to be tested.

Based on the read data MEMRO [9:0] from the memory MEMR to be tested and the output redundancy codes RDNCSELO [7:0] from the redundancy code selector RDNCSEL, the redundancy output data switching circuit RDNO outputs the redundancy output data RDNOO [7:0] obtained by removing data for the redundant bits from the read data MEMRO [9:0] to the output data selector RDISELO.

Since the signal level of the redundancy direct switching signal RDNDISEL is a LOW level, the output data selector RDISELO selects the redundancy output data RDNOO [7:0] from the redundancy output data switching circuit RDNO and outputs the selected data as the output selecting data RDISELOO [7:0] to the memory BIST comparator MBCMPM.

Since the signal level of the redundancy direct switching signal RDNDISEL is LOW level, the memory BIST comparator MBCMPM covers only 8 bits of the output selecting data RDISELOO [7:0] from the output data selector RDISELO. The memory BIST comparator MBCMPM checks the values represented by the output selecting data RDISELOO [7:0] with the expectation values for the actual array portion among the checking expectation values COMPVAL [9:0] and outputs the checking result as the memory BIST test result STATUS.

[Effects]

As described above, in the memory test circuit according to the embodiment of the present invention, in order to extend the test range, the two test paths in the direct memory BIST mode and the redundancy memory BIST mode are realized. Thus, the memory test circuit according to the embodiment of the present invention can perform memory BIST that covers all of the bits for the actual array portion and the redundant portion of the memory MEMR to be tested in the direct memory BIST mode, and memory BIST that covers only bits for the actual array portion of the memory MEMR to be tested in the redundancy memory BIST mode. As described above, the memory test circuit according to the embodiment of the present invention can separately test the actual array portion and the redundant portion. Therefore, the test quality is not lowered than conventional.

Although the signal levels of the redundancy direct switching signal RDNDISEL, the redundancy code switching signal RDNCODESEL and the mode switching signal MODE are set to a HIGH level, a HIGH level and a LOW level, respectively, in the direct memory BIST mode, and to a LOW level, a HIGH level and a HIGH level in the redundancy memory BIST mode, the present invention is not limited to this and these levels may be inverted.

It is apparent that the present invention is not limited to the above embodiment, but may be modified and changed without departing from the scope and spirit of the invention.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A memory test circuit which tests a test target memory including an actual array portion and a redundancy portion, comprising:
    an input data selector configured to output first test data excluding data for said redundancy portion in test data representing data for said actual array portion and said redundancy portion as input selecting data in a redundancy memory BIST (Built In Self Test) mode;
    an input data switching circuit configured to output said test data as output test data to said test target memory in a direct memory BIST mode, and output data obtained by adding redundancy bits to said input selecting data as said output test data to said test target memory based on said input selecting data and output redundancy codes representing redundancy codes in said redundancy memory BIST mode;
    an output data switching circuit configured to output data obtained by removing said redundancy bits from read data as output selecting data based on said read data from said test target memory and said output redundancy codes in said redundancy memory BIST mode; and
    a memory BIST comparator configured to check a value of said read data with a checking expectation value to output a result of said checking as a test result in said direct memory BIST mode, and check a value of said output selecting data with an expectation value for said actual array portion in said checking expectation value to output a result of said checking as said test result in said redundancy memory BIST mode.

2. The memory test circuit according to claim 1, wherein said input data switching circuit includes:
a redundancy input data switching circuit configured to output redundancy input data obtained by adding said redundancy bits to said input selecting data based on said input selecting data and said output redundancy codes in said redundancy memory BIST mode, and
a redundancy direct data selector configured to output said test data as said output test data to said test target memory in said direct memory BIST mode, and output said redundancy input data as said output test data to said test target memory in said redundancy memory BIST mode.

3. The memory test circuit according to claim 1, wherein said output data switching circuit includes:
a redundancy output data switching circuit configured to output redundancy output data obtained by removing said redundancy bits from said read data based on said read data and said output redundancy codes in said redundancy memory BIST mode, and
an output data selector configured to output a first read data obtained by removing read data for said redundancy portion from said read data as said output selecting data to said memory BIST comparator in said direct memory BIST mode, and output said redundancy output data as said output selecting data to said memory BIST comparator in said redundancy memory BIST mode,
wherein said memory BIST comparator checks said read data for said redundancy portion and said output selecting data with said checking expectation value to output a result of said checking as said test result in said direct memory BIST mode, and checks a value of said output selecting data with an expectation value for said actual array portion in said checking expectation value to output a result of said checking as said test result in said redundancy memory BIST mode.

4. The memory test circuit according to claim 1, further comprising:
a memory BIST controller configured to output said test data and said checking expectation value for said test data.

5. The memory test circuit according to claim 1, further comprising:
a test access port controller configured to output test redundancy codes representing said redundancy codes; and
an input data selector configured to output said test redundancy codes as said output redundancy codes to said input data switching circuit in said redundancy memory BIST mode.

6. The memory test circuit according to claim 1, wherein said redundancy codes is obtained from said test result in a case where said direct memory BIST mode is performed.

7. A semiconductor integrated circuit comprising:
a test target memory configured to include an actual array portion and a redundancy portion; and
a memory test circuit configured to test said test target memory,
wherein said memory test circuit includes:
an input data selector configured to output first test data excluding data for said redundancy portion in test data representing data for said actual array portion and said redundancy portion as input selecting data in a redundancy memory BIST (Built In Self Test) mode,
an input data switching circuit configured to output said test data as output test data to said test target memory in a direct memory BIST mode, and output data obtained by adding redundancy bits to said input selecting data as said output test data to said test target memory based on said input selecting data and output redundancy codes representing redundancy codes in said redundancy memory BIST mode,
an output data switching circuit configured to output data obtained by removing said redundancy bits from read data as output selecting data based on said read data from said test target memory and said output redundancy codes in said redundancy memory BIST mode, and
a memory BIST comparator configured to check a value of said read data with a checking expectation value to output a result of said checking as a test result in said direct memory BIST mode, and check a value of said output selecting data with an expectation value for said actual array portion in said checking expectation value to output a result of said checking as said test result in said redundancy memory BIST mode.

8. The semiconductor integrated circuit according to claim 7, wherein said input data switching circuit includes:
a redundancy input data switching circuit configured to output redundancy input data obtained by adding said redundancy bits to said input selecting data based on said input selecting data and said output redundancy codes in said redundancy memory BIST mode, and
a redundancy direct data selector configured to output said test data as said output test data to said test target memory in said direct memory BIST mode, and output said redundancy input data as said output test data to said test target memory in said redundancy memory BIST mode.

9. The semiconductor integrated circuit according to claim 7, wherein said output data switching circuit includes:
a redundancy output data switching circuit configured to output redundancy output data obtained by removing said redundancy bits from said read data based on said read data and said output redundancy codes in said redundancy memory BIST mode, and
an output data selector configured to output a first read data obtained by removing read data for said redundancy portion from said read data as said output selecting data to said memory BIST comparator in said direct memory BIST mode, and output said redundancy output data as said output selecting data to said memory BIST comparator in said redundancy memory BIST mode,
wherein said memory BIST comparator checks said read data for said redundancy portion and said output selecting data with said checking expectation value to output a result of said checking as said test result in said direct memory BIST mode, and checks a value of said output selecting data with an expectation value for said actual array portion in said checking expectation value to output a result of said checking as said test result in said redundancy memory BIST mode.

10. The semiconductor integrated circuit according to claim 7, wherein said memory test circuit further includes:
a memory BIST controller configured to output said test data and said checking expectation value for said test data.

11. The semiconductor integrated circuit according to claim 7, wherein said memory test circuit further includes:

a test access port controller configured to output test redundancy codes representing said redundancy codes, and an input data selector configured to output said test redundancy codes as said output redundancy codes to said input data switching circuit in said redundancy memory BIST mode.

12. The semiconductor integrated circuit according to claim 7, wherein said redundancy codes is obtained from said test result in a case where said direct memory BIST mode is performed.

13. A memory test method of testing a test target memory including an actual array portion and a redundancy portion, comprising:

outputting test data representing data for said actual array portion and said redundancy portion as output test data to said test target memory in a direct memory BIST (Built In Self Test) mode;

checking a value of read data from said test target memory with a checking expectation value to output a result of said checking as a test result in said direct memory BIST mode;

outputting first test data excluding data for said redundancy portion in said test data as input selecting data in a redundancy memory BIST mode;

outputting data obtained by adding redundancy bits to said input selecting data as said output test data to said test target memory based on said input selecting data and output redundancy codes representing redundancy codes in said redundancy memory BIST mode;

outputting data obtained by removing said redundancy bits from read data as output selecting data based on said read data from said test target memory and said output redundancy codes in said redundancy memory BIST mode; and checking a value of said output selecting data with an expectation value for said actual array portion in said checking expectation value to output a result of said checking as said test result in said redundancy memory BIST mode.

14. The semiconductor integrated circuit according to claim 13, wherein said redundancy codes is obtained from said test result in a case where said direct memory BIST mode is performed.

* * * * *